United States Patent
Liu et al.

(10) Patent No.: US 8,872,339 B2
(45) Date of Patent: Oct. 28, 2014

(54) SEMICONDUCTORS STRUCTURE WITH ELEMENTS HAVING DIFFERENT WIDTHS AND METHODS OF MAKING THE SAME

(75) Inventors: Chia-Chu Liu, Shin-Chu (TW); Yi-Shien Mor, Hsinchu (TW); Kuei Shun Chen, Hsinchu (TW); Yu Lun Liu, Beidou Township (TW); Han-Hsun Chang, Hsinchu (TW); Shiao-Chian Yeh, Kaohsiung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/370,828

(22) Filed: Feb. 10, 2012

(65) Prior Publication Data

US 2013/0207265 A1 Aug. 15, 2013

(51) Int. Cl.
*H01L 23/482* (2006.01)
*H01L 23/485* (2006.01)
*H01L 21/02* (2006.01)

(52) U.S. Cl.
USPC ............ 257/741; 257/E23.017; 257/E23.019; 257/E21.002; 257/E21.24; 257/E21.422; 257/773; 257/305; 257/369; 257/311; 257/324

(58) Field of Classification Search
USPC .................. 257/E21.422, 305, 369, 311, 324, 257/E21.24, 741, 773, E23.07, E23.019, 257/E21.002
See application file for complete search history.

(56) References Cited

U.S. PATENT DOCUMENTS

| | | | |
|---|---|---|---|
| 5,814,553 A * | 9/1998 | Chuang et al. | 438/595 |
| 6,133,115 A * | 10/2000 | Fukase | 438/430 |
| 6,436,412 B1 * | 8/2002 | Quinn | 424/401 |
| 7,972,926 B2 * | 7/2011 | Kewley et al. | 438/264 |
| 8,476,763 B2 * | 7/2013 | Kim et al. | 257/741 |
| 2006/0152668 A1 * | 7/2006 | Jang et al. | 349/156 |
| 2007/0184664 A1 * | 8/2007 | Lee et al. | 438/706 |
| 2008/0303037 A1 * | 12/2008 | Irving et al. | 257/88 |
| 2009/0075489 A1 * | 3/2009 | Wang et al. | 438/787 |
| 2009/0101988 A1 * | 4/2009 | Kohli | 257/378 |
| 2009/0207662 A1 * | 8/2009 | Wang et al. | 365/185.18 |
| 2009/0253263 A1 * | 10/2009 | Lee et al. | 438/689 |
| 2010/0327396 A1 * | 12/2010 | Park et al. | 257/506 |
| 2011/0003469 A1 * | 1/2011 | Kewley et al. | 438/591 |
| 2011/0237081 A1 * | 9/2011 | Kewley et al. | 438/696 |
| 2011/0241119 A1 * | 10/2011 | Chen et al. | 257/368 |
| 2011/0285036 A1 * | 11/2011 | Yao et al. | 257/797 |
| 2011/0294286 A1 * | 12/2011 | Hung et al. | 438/587 |
| 2012/0015494 A1 * | 1/2012 | Kobayashi et al. | 438/386 |
| 2012/0193792 A1 * | 8/2012 | Kim et al. | 257/741 |
| 2013/0200487 A1 * | 8/2013 | Park et al. | 257/508 |

* cited by examiner

*Primary Examiner* — Alexander Oscar Williams
(74) *Attorney, Agent, or Firm* — Lowe Hauptman & Ham, LLP

(57) ABSTRACT

A structure includes a substrate, a first supporting member over the substrate, a second supporting member over the substrate, and a layer of material over the substrate and covering the first supporting member and the second supporting member. The first supporting member has a first width, and the second supporting member has a second width. The first supporting member and the second supporting member are separated by a gap region. The first width is at least 10 times the second width, and a gap width of the gap region ranges from 5 to 30 times the second width.

20 Claims, 5 Drawing Sheets

SEMICONDUCTORS STRUCTURE WITH ELEMENTS HAVING DIFFERENT WIDTHS AND METHODS OF MAKING THE SAME

BACKGROUND

In the course of integrated circuit (IC) evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. Meanwhile, some components and devices in an IC chip still have a relatively larger size for applications such as analog circuits or high-power circuits than those for applications such as digital circuits. Various manufacturing processes have been introduced to effectively components and devices having various sizes in a single IC chip.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1A:
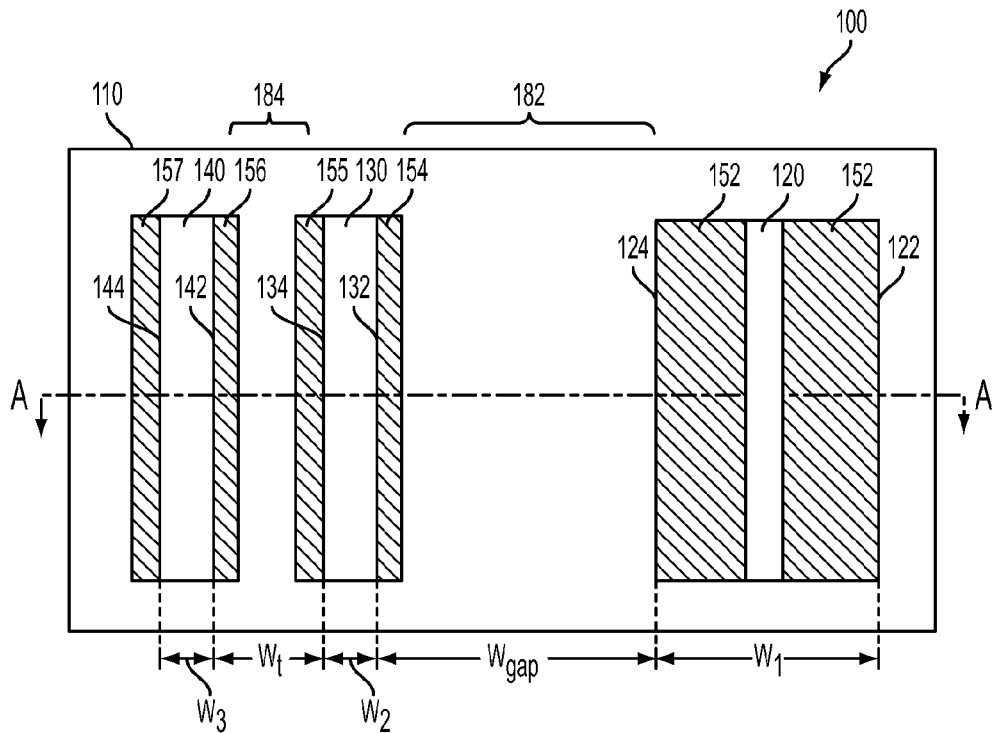
FIG. 1A is a top view of a structure in accordance with one or more embodiments.

It is understood that the following disclosure provides many different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

The formation of a feature on, connected to, and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1B:
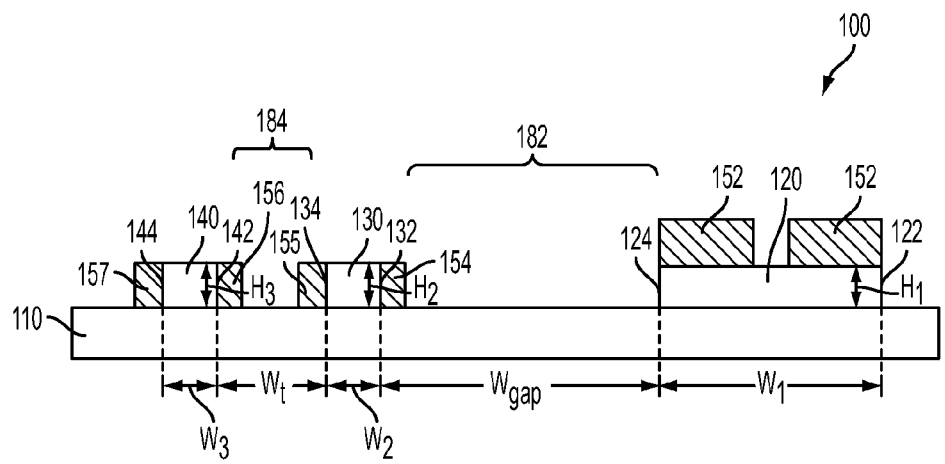
FIG. 1B is a cross-sectional view of the structure of FIG. 1A taken from line A in accordance with one or more embodiments.

FIG. 1A is a top view of a structure 100 in accordance with one or more embodiments. FIG. 1B is a cross-sectional view of the structure 100 of FIG. 1A taken from line A in accordance with one or more embodiments. The structure 100 includes a substrate 110, a first supporting member 120 having side walls 122 and 124, a second supporting member 130 having side walls 132 and 134, and a third supporting member 140 having side walls 142 and 144. The first, second, and third supporting members 120, 130, and 140 are over the substrate 110. In at least one embodiment, the first supporting member 120, the second supporting member 130, and the third supporting member 140 are parallel with one another. In some embodiments, the structure 100 further includes one or more patterned features 152 over the first supporting member 120, one or more strips 154 or 155 on side walls 132 or 134 of the second supporting member 130, and one or more strips 156 and 157 on side walls 142 or 144 of the third supporting member 140. In some embodiments, the patterned features 152 are conductive features, and the strips 154, 155, 156, and 157 are conductive strips. In some embodiments, the structure 100 is a semiconductor structure.

In some embodiments, the substrate 110 includes: an elemental semiconductor such as silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 110 is an alloy semiconductor substrate having a gradient SiGe feature in which the respective Si and Ge concentrations change from one ratio at one location to another ratio at another location of the gradient SiGe feature. In another embodiment, the alloy SiGe is formed over a silicon substrate. In yet another embodiment, a SiGe substrate is strained. In some embodiments, the semiconductor substrate 110 has a semiconductor-on-insulator (SOI) structure. In some embodiments, the semiconductor substrate 110 includes a doped epitaxial layer or a buried layer. In other examples, the compound semiconductor substrate has a multilayer structure, or the substrate includes a multilayer compound semiconductor structure.

The first supporting member 120 has a first width $W_1$ defined as a distance between the side walls 122 and 124 at the points of intersection of a reference cross-sectional plane containing the line A and being perpendicular to a planar direction of the substrate 110. The first supporting member 120 also has a first height $H_1$ measurable along the reference cross-sectional plane. The second supporting member 130 has a second width $W_2$ defined as a distance between the side walls 132 and 134 at the points of intersection of the reference cross-sectional plane. The second supporting member 130 also has a second height $H_2$ measurable along the reference cross-sectional plane. The third supporting member 140 has a third width $W_3$ defined as a distance between the side walls 142 and 144 at the points of intersection of the reference cross-sectional plane. The third supporting member 140 also has a third height $H_3$ measurable along the reference cross-sectional plane.

The first supporting member 120 and the second supporting member 130 are separated by a gap region 182. The gap region 182 has a gap width $W_{gap}$ defined as a distance between the side wall 124 and the sidewall 132 along the reference cross-sectional plane. Also, the second supporting member 130 and the third supporting member 140 are separated by a trench region 184. The trench region 184 has a trench width $W_t$ defined as a distance between the side wall 134 and the sidewall 142 along the reference cross-sectional plane.

Figure 3A:
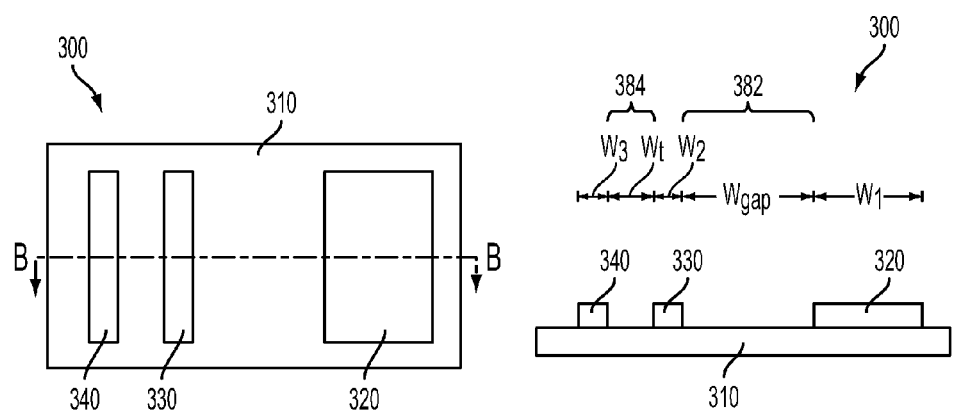
FIGS. 3A-3G are top views and corresponding cross-sectional views of a structure at various manufacturing stages in accordance with one or more embodiments.
Figure 3B:
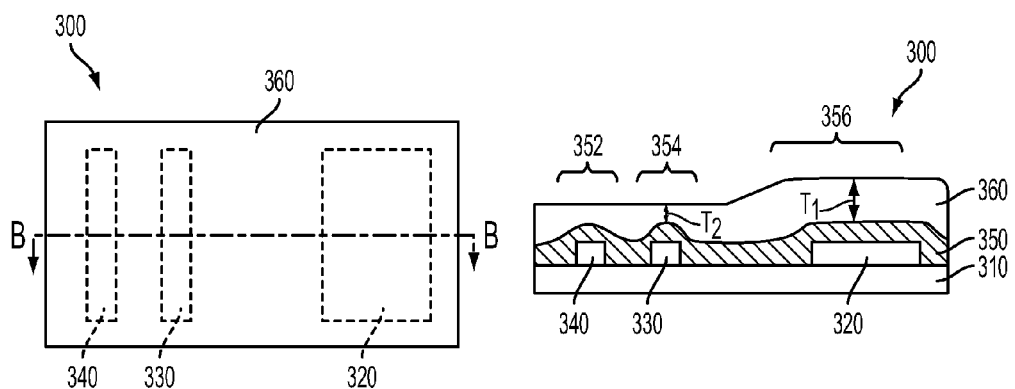

In some embodiments, the gap region 180 is substantially free of any feature that interferes with formation of the photoresist layer 360 as depicted in FIG. 3B.

In some embodiments, the first width $W_1$ is at least 10 times the second width $W_2$, and the gap width $W_{gap}$ of the gap region 180 ranges from 5 to 30 times the second width $W_2$. In some embodiments, the second width $W_2$ ranges from 0.8 to 1.2 times the third width $W_3$. In some embodiments, the trench width $W_t$ ranges from 2.0 to 3.0 times the second width $W_2$.

In some embodiments, the second width $W_2$ is equal to or less than 100 nm. In at least one embodiment, the second width $W_2$ ranges from 30 nm to 90 nm, the first width $W_1$ ranges from 300 nm to 900 nm, and the gap width $W_{gap}$ ranges from 200 nm to 1,000 nm.

In some embodiments, the first height $H_1$ ranges from 30 nm to 90 nm. In some embodiments, the second height $H_2$ ranges from 30 nm to 90 nm. In some embodiments, the third height $H_3$ ranges from 30 nm to 90 nm.

The first supporting member 120 is not limited to any particular size. In some embodiments, when viewed from the top as in FIG. 1A, the first supporting member 120 has a dimension ranging from 300 nm to 30,000 nm. In some embodiments, the range is from 500 nm to 2,000 nm or from 700 nm to 1,500 nm.

The second or third supporting members 130 or 140 are not limited to any particular size. In some embodiments, when viewed from the top as in FIG. 1A, the second supporting member 130 or the third supporting member 140 independently has a length ranging from 300 nm to 30,000 nm. In some embodiments, the range is from 500 nm to 2,000 nm or from 700 nm to 1,500 nm.

The first supporting member 120 is not limited to any particular shape. In some embodiments, the first supporting member 120 has a shape that lacks symmetry. In some embodiments, the first supporting member 120 has symmetry. In some embodiments, when viewed from the top, the first supporting member 120 has a shape that is rectangular, circular, or triangular.

The second or third supporting member 130 or 140 is not limited to any particular shape. In some embodiments, the second or third supporting member 130 or 140 has a shape that lacks symmetry. In some embodiments, the second or third supporting member 130 or 140 has symmetry. In some embodiments, when viewed from the top, the second or third supporting member 130 or 140 has a shape that is rectangular, circular, or triangular. In some embodiments, the second and third supporting members 130 and 140 have substantially the same shape. In some embodiments, the second and third supporting members 130 and 140 have different shapes.

In at least one embodiment, the first, second, and third supporting members 120, 130, and 140 are rectangular and arranged to be in parallel with one another.

In some embodiments, the third supporting member 140 is omitted.

In some embodiments, the first supporting member 120, the second supporting member 130, and the third supporting member 140 include a first material chosen from insulation materials. In some embodiments, the insulation materials include silicon dioxide or silicon nitride. In some embodiments, the first supporting member 120, the second supporting member 130, and the third supporting member 140 are formed of different materials.

In at least one embodiment, the patterned features 152 are usable for forming relatively larger components and devices such as capacitors, antennas, or resistors in an IC chip.

In some embodiments, the strips 154, 155, 156, and 157 are usable for forming relatively smaller components and devices such as electrodes or dummy gate electrodes of transistors in the same IC chip.

In some embodiments, the patterned features 152 and the strips 154, 155, 156, and 157 include a material chosen from conductive materials. In some embodiments, the conductive materials include polycrystalline silicon. In some embodiments, the patterned features 152 and the strips 154, 155, 156, and 157 are formed of different materials. In some embodiments, the patterned features 152 and the strips 154, 155, 156, and 157 include any suitable materials for use in semiconductor manufacturing, such as metallic materials, semiconductor materials, dielectric materials, or hardmask materials. In some embodiments, the patterned features 152 and the strips 154, 155, 156, and 157 comprise silicon nitride, silicon oxide, nitride with carbide doped, oxynitride, aluminum oxide, or carbide.

The widths $W_1$, $W_2$, $W_3$, $W_{gap}$, and/or $W_t$ are determinable by one of ordinary skill in the art using, e.g., any suitable metrology tool.

In some embodiments, the first supporting member 120, the second supporting member 130, and the third supporting member 140 are rectangular, and the reference cross-sectional plane is positioned anywhere along the structure 100. In some embodiments, the reference cross-sectional plane is positioned where the above-mentioned relationships among the widths $W_1$, $W_2$, $W_3$, $W_{gap}$, and/or $W_t$ are satisfied.

Figure 2:
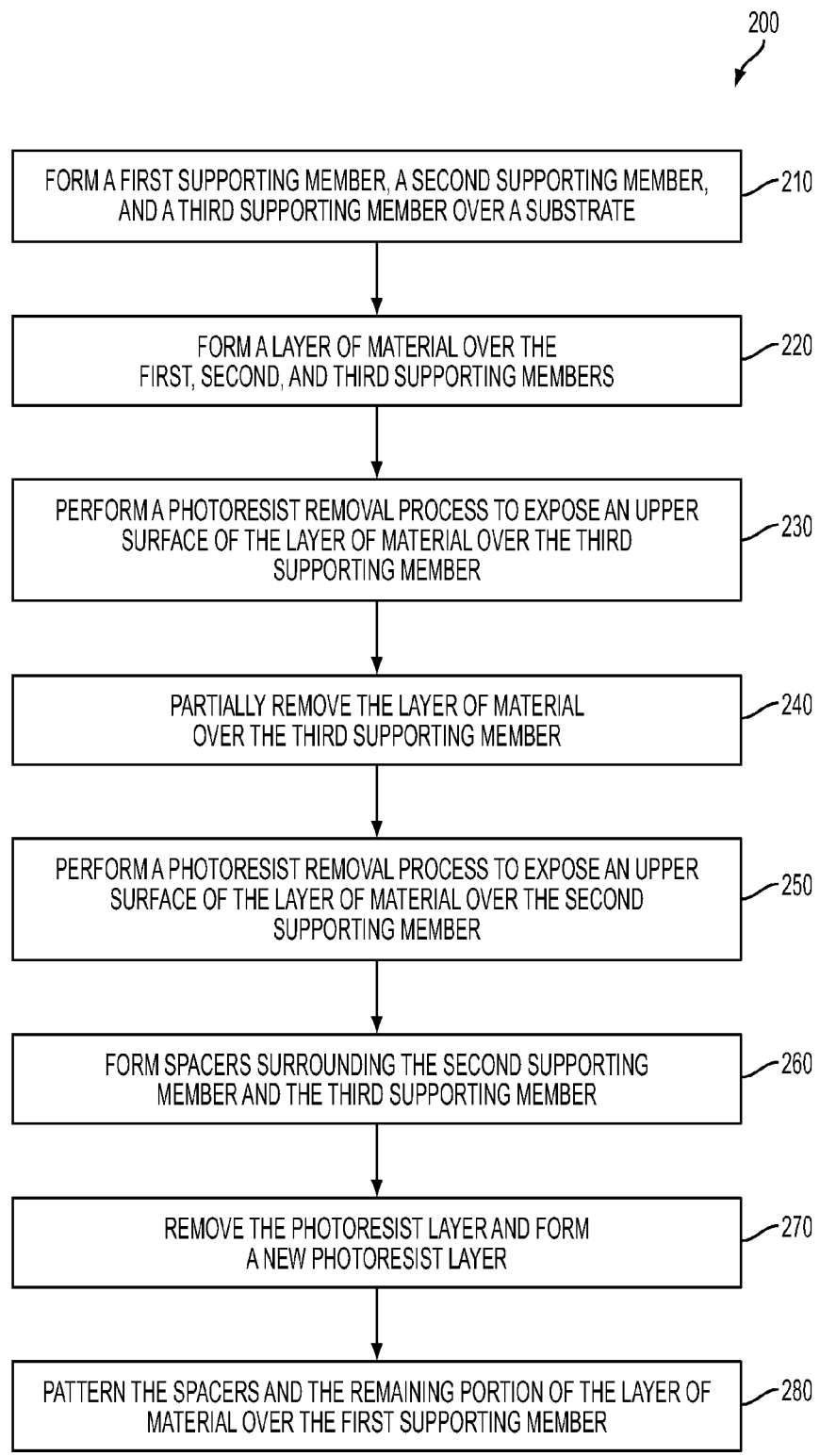
FIG. 2 is a flow chart of a method of manufacturing a structure in accordance with one or more embodiments.

FIG. 2 is a flow chart of a method 200 of manufacturing a semiconductor structure (such as the semiconductor 300 depicted in FIG. 3G) in accordance with one or more embodiments. FIGS. 3A-3G are top views and corresponding cross-sectional views, taken from line B depicted in the top views, of a semiconductor structure 300 at various manufacturing stages in accordance with one or more embodiments. In some embodiments, the semiconductor structure 300 is usable as the structure 100 of FIG. 1A and FIG. 1B. It is understood that additional processes may be performed before, during, and/or after the method 200 depicted in FIG. 2, and that some other processes may only be briefly described herein. Others will be ascertainable to those having ordinary skill in the art.

As depicted in FIG. 2 and FIG. 3A, in operation 210, a first supporting member 320, a second supporting member 330, and a third supporting member 340 are formed over a substrate 310. The third supporting member 340 is farther from the first supporting member 320 than the second supporting member 330. The substrate 310 corresponds to the substrate 110 in FIG. 1, and the first supporting member 320, the second supporting member 330, and the third supporting member 340 correspond to the first supporting member 120, the second supporting member 130, and the third supporting member 140 in FIG. 1. Therefore, the widths of and the spacing between the first supporting member 320, the second supporting member 330, and the third supporting member 340 have analogous relationships as described above for the first supporting member 120, the second supporting member 130, and the third supporting member 140 in FIG. 1.

For example, the first supporting member 320 has a width (also denoted as $W_1$), the second supporting member 330 has a width (also denoted as $W_2$), and the third supporting member 340 has a width (also denoted as $W_3$). The first supporting member 320 and the second supporting member 330 are separated by a gap region 382 having a gap width (also denoted as $W_{gap}$). Also, the second supporting member 330 and the third supporting member 340 are separated by a trench region 384 having a trench width (also denoted as $W_t$).

In some embodiments, the gap region 382 is substantially free of any feature that interferes with formation of the photoresist layer 360 as depicted in FIG. 3B.

In some embodiments, each of the first supporting member 320, the second supporting member 330, and the third supporting member 340 independently comprises silicon dioxide or silicon nitride. In some embodiments, the first supporting member 320, the second supporting member 330, and the third supporting member 340 are formed by first forming a layer of supporting material followed by performing a patterning process to pattern the layer of supporting material. In some embodiments, the formation of the layer of supporting material includes performing a chemical vapor deposition (CVD), a physical vapor deposition (PVD), or a thermal oxidation process. In some embodiments, the patterning process for forming the first supporting member 320, the second supporting member 330, and the third supporting member 340 includes forming a patterned mask over the layer of supporting material and then partially removing the layer of material by a dry etching process or a wet etching process to form the supporting members 320, 330, and 340.

In some embodiments, the third supporting member 340 is omitted. In some embodiments, one or more supporting members resembling the second or third supporting member 330 or 340 are formed to the left of the third supporting member 340 (i.e., the direction away from the first supporting member 320).

As depicted in FIG. 2 and FIG. 3B, in operation 220, a layer of material 350 is formed over the substrate 310 and covering upper surfaces and sidewalls of the first supporting member 320, the second supporting member 330, and the third supporting member 340 at least along the reference plane containing the line B and being perpendicular to an planar direction of the substrate 310. The layer of material 350 includes a portion 352 over and covering the third supporting member 350, a portion 354 over and covering the second supporting member 330, and a portion 356 over and covering the first supporting member 320. In some embodiments, the layer of material 350 includes any suitable materials for use in semiconductor manufacturing, such as metallic materials, semiconductor materials, dielectric materials, or hardmask materials. In some embodiments, the layer of material 350 comprises silicon nitride, silicon oxide, nitride with carbide doped, oxynitride, aluminum oxide, or carbide. In at least one embodiment, the layer of material 350 includes a conductive material such as polycrystalline silicon.

Returning to FIG. 2, in operation 230, a photoresist layer 360 is formed over the layer of material 350. The photoresist layer 360 has a first thickness $T_1$ over the first supporting member 320 and a second thickness $T_2$ over the second supporting member 330. In some embodiments, $W_1$, $W_2$, and $W_{gap}$ are chosen such that the photoresist layer 350 will be thicker over the first supporting member 320 than over the second supporting member 330 during the deposition or coating of the photoresist layer 360 over the first and second supporting members 320 and 330. In some embodiments, the first thickness $T_1$ is greater than the second thickness $T_2$. In some embodiments, the first thickness $T_1$ is at least 50 nm greater than the second thickness $T_2$.

In some embodiments, the photoresist layer 360 includes a light-sensitive material usable to form a patterned coating on a surface. In some embodiments, the photoresist layer 360 includes negative photoresist materials or positive photoresist mateirals. In some embodiments, the photoresist layer 360 comprises acrylates, such as poly(methyl methacrylate); imides, such as poly(methyl glutarimide), phenols such as phenol formaldehyde resin, or epoxys such as SU-8. In some embodiments, the photoresist layer 360 comprises acrylate or methacrylate monomer.

Figure 3C:
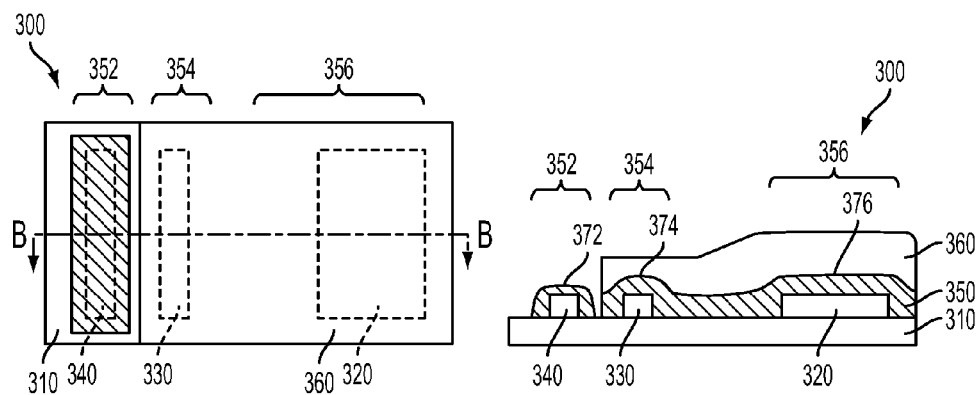

As depicted in FIG. 2 and FIG. 3C, in operation 230, a photoresist removal process is performed to expose an upper surface 372 of the portion 352 of the layer of material 350 over and covering the third supporting member 340, without exposing upper surfaces 374 and 376 of other portions (such as the portions 354 and 356) of the layer of material 350. In some embodiments, the photoresist removal process includes partially exposing the photoresist layer 360 by using a lithographic process and subsequently removing the exposed portion of the photoresist layer 360 by using a photoresist development process.

As depicted in FIG. 2 and FIG. 3C, in operation 240, the exposed portion 352 of the layer of material 350 is partially removed by performing an etching process. In at least one embodiment, the removal process in operation 240 is configured to fabricate a space 352' (FIG. 3E) surrounding the third supporting member 340 having a thickness thinner than a space 352' (FIG. 3E) surrounding the second supporting member 330 after the performance of operation 260 (FIG. 2). In some embodiments, the third supporting member 340 is omitted. In some embodiments, operations 230 and 240 are omitted, and thus the second supporting member 330 and the third supporting member 340 are identically processed. During the etching process, the photoresist layer 360 is used as a mask to protect the portions 374 and 376 of the layer of material 350 from being removed.

Figure 3D:
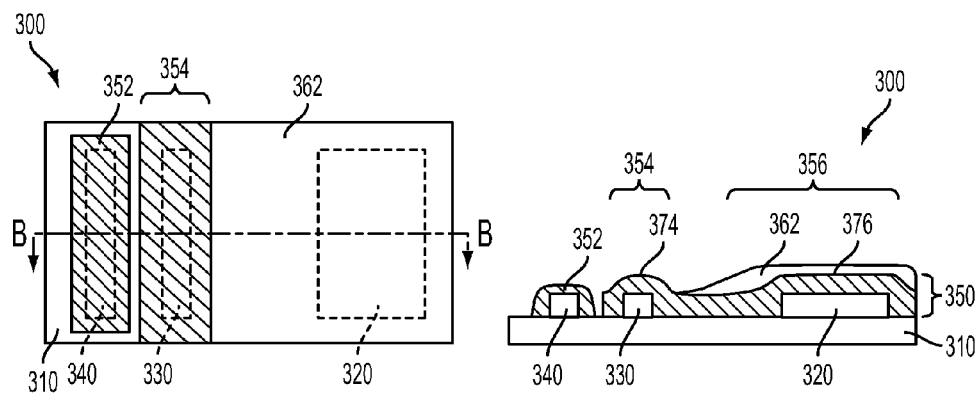

As depicted in FIG. 2 and FIG. 3D, in operation 250, a photoresist removal process is performed to expose an upper surface 374 of the portion 354 of the layer of material 350 over and covering the second supporting member 330, without exposing an upper surface 376 of the portion 356 of the layer of material 350. In some embodiments, the photoresist removal process includes performing an ashing process for a predetermined period of time sufficient to remove the photoresist material over the second supporting member 330 and the portion 354 of the layer of material 350.

Because of the thickness $T_2$ of the photoresist layer 360 over the second supporting member 330 is less than the thickness $T_1$ of the photoresist layer 360 over the first supporting member 330, a film of photoresist material (being referred to as a photoresist film 362) remains and covers at least the upper surface 376 of the portion 356 of the layer of material 350 over and covering the first supporting member 320.

Figure 3E:
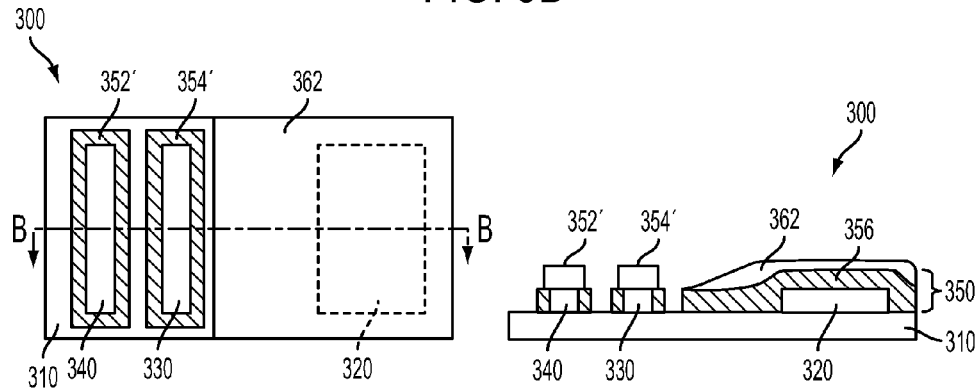

As depicted in FIG. 2 and FIG. 3E, in operation 260, the exposed portions 352 and 354 of the layer of material 350 are partially removed by performing an etching process in order to form spacers 352' and 354' surrounding the second supporting member 330 and the third supporting member 340. During the etching process, the photoresist film 362 is used, e.g., as a mask, to protect the portion 356 of the layer of material 350. The operation 260 is configured to reveal upper surfaces of the second and third supporting members 330 and 340. The operation 260 is also configured to form the spacers 352' and 354' each having a predetermined spacer width.

Figure 3F:
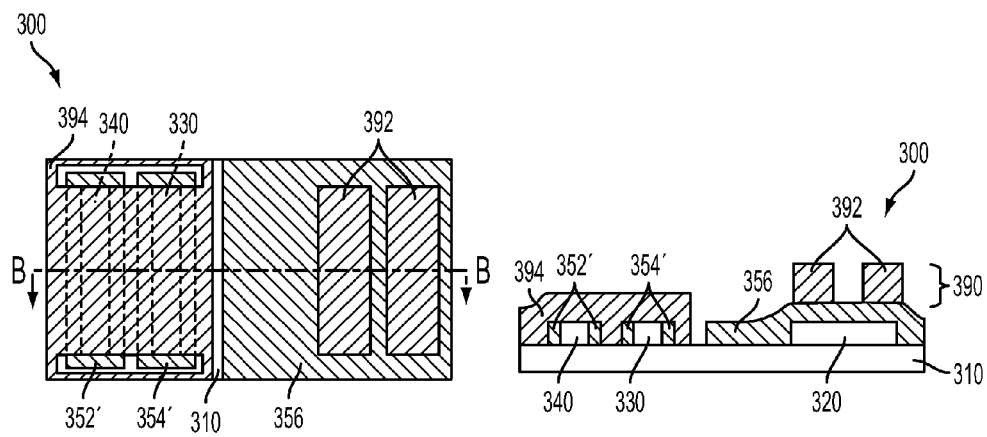

As depicted in FIG. 2 and FIG. 3F, in operation 270, the photoresist film 376 is removed. Another photoresist layer 390 is deposited or coated over the first, second, and third supporting members 320, 330, and 340. The photoresist layer 390 is subsequently patterned to form patterned photoresist feature 392 over the first supporting member and patterned photoresist feature 394 over the portion 356 of the layer of material 350 and the spacers 352' and 354'. The patterned photoresist features 392 and 394 are arranged to be masks for selectively etching the portion 356 of the layer of material 350 and the spacers 352' and 354'.

Figure 3G:
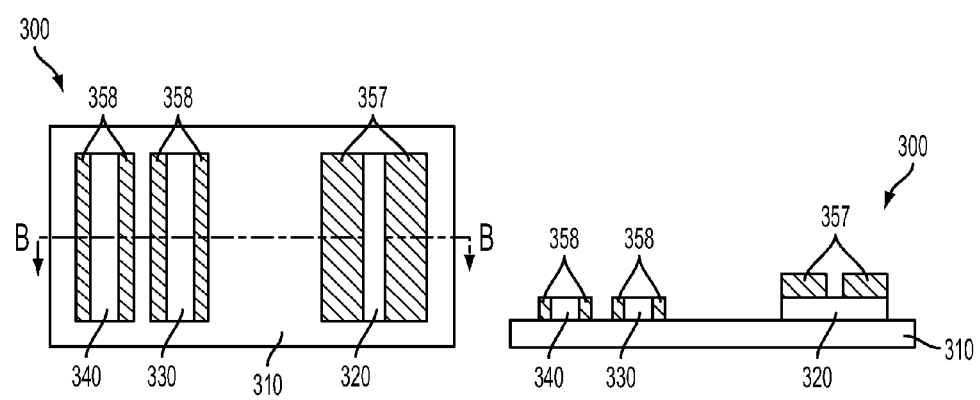

As depicted in FIG. 2 and FIG. 3G, in operation 280, the portion 356 of the layer of material 350 and the spacers 352' and 354' are further patterned, by using the patterned photoresist features 392 and 394 as masks in an etching process, to form patterned features 357 over the first supporting member 320 and strips 358 on sidewalls of the second and third supporting members 330 and 340. In some embodiments, the patterned features 357 correspond to the patterned feature 152 in FIG. 1, and the strips 358 correspond to the strips 154, 155, 156, and 157 in FIG. 1.

In some embodiments, the patterned features 357 are further processed for forming relatively larger components and devices such as capacitors, antennas, or resistors in an IC chip. In some embodiments, the strips 358 are processed for forming relatively smaller components and devices such as electrodes or dummy gate electrodes of transistors in the same IC chip.

The structure 100 is subject to multiple uses. In some embodiments, the structure 100 is an intermediate product used to form an integrated circuit chip. The method 200 is subject to many applications. In some embodiments, the method 200 constitutes a portion of a manufacturing process for making an integrated circuit chip.

In accordance with some embodiments a structure includes a substrate, a first supporting member over the substrate, a second supporting member over the substrate, and a layer of material over the substrate and covering the first supporting member and the second supporting member. The first supporting member has a first width, and the second supporting member a second width. The first supporting member and the second supporting member are separated by a gap region. The first width is at least 10 times the second width, and a gap width of the gap region ranges from 5 to 30 times the second width.

In accordance with some embodiments, a method of making a structure includes forming a first supporting member and a second supporting member over a substrate. The first supporting member has a first width, and the second supporting member has a second width. The first supporting member and the second supporting member are separated by a gap region. The first width is at least 10 times the second width, and a gap width of the gap region ranges from 5 to 30 times the second width.

In accordance with some embodiments, a semiconductor structure includes a substrate, a first supporting member over the substrate, a second supporting member over the substrate, a conductive feature over the first insulation member, and a conductive strip on a side wall of the second insulation member. The first supporting member has a first width, and the second supporting member has a second width. The first width is at least 10 times the second width. A gap width of a gap between the first and the second insulation members ranges from 5 to 30 times the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a substrate;
   a first supporting member over the substrate, the first supporting member comprising a first material and having a first width defined along a reference plane;
   a second supporting member over the substrate, the second supporting member having a second width defined along the reference plane, and the first supporting member and the second supporting member being separated by a gap region; and
   a layer of material over the substrate and covering, along the reference plane, the first supporting member and the second supporting member,
   the first width being at least 10 times the second width, and a gap width of the gap region being from 5 to 30 times the second width.

2. The structure of claim 1, further comprising a photoresist layer over the layer of material.

3. The structure of claim 2, wherein the photoresist layer has a first thickness over the first supporting member and a second thickness over the second supporting member, and the first thickness is greater than the second thickness.

4. The structure of claim 3, wherein the first thickness is at least 50 nm greater than the second thickness.

5. The structure of claim 1, wherein the first material comprises silicon dioxide or silicon nitride.

6. The structure of claim 1, wherein the layer of material comprises polycrystalline silicon.

7. The structure of claim 1, wherein the second width ranges from 30 nm to 90 nm.

8. The structure of claim 1, wherein the first width ranges from 300 nm to 900 nm.

9. The structure of claim 1, wherein the gap width ranges from 200 nm to 1,000 nm.

10. A semiconductor structure, comprising:
    a substrate;
    a first supporting member over the substrate, the first supporting member having a first width;
    a second supporting member over the substrate, the second supporting member having a second width;
    a conductive feature over the first supporting member; and
    a conductive strip on a side wall of the second supporting member,
    the first width being at least 10 times the second width, and a gap width of a gap between
    the first and the second insulation members being from 5 to 30 times the second width.

11. The semiconductor structure of claim 10, wherein the second width ranges from 30 nm to 90 nm, the first width ranges from 300 nm to 900 nm, and the gap width ranges from 200 nm to 1,000 nm.

12. A structure comprising:
    a first supporting member over a substrate, the first supporting member having a first width;
    a second supporting member over the substrate, the second supporting member having a second width;
    a third supporting member over the substrate between the first support member and the second supporting member, the third supporting member having a third width;
    a gap region between the first support member and the second supporting member, the gap region having a gap width; and a conductive strip along sidewalls of the second supporting member, wherein surfaces of the second supporting member perpendicular to the sidewalls are free of the conductive strip, wherein the first width is at least 10 times greater than the third width.

13. The structure of claim 12, further comprising:

at least one patterned feature comprising a first component over the first supporting member;

a first strip comprising a second component along sidewalls of the second supporting member; and a second strip comprising a third component along sidewalls of the third support member, wherein the first component is different from the second component and the third component.

14. The structure of claim 12, wherein a ratio of the third width to the second width ranges from about 0.8 to about 1.2.

15. The structure of claim 12, further comprising a trench between the second supporting member and the third supporting member.

16. The structure of claim 12, wherein a height of the first supporting member ranges from about 30 nm to about 90 nm, a height of the second supporting member ranges from about 30 nm to about 90 nm, and a height of the third supporting member ranges from about 30 nm to about 90 nm.

17. The structure of claim 12, wherein a length of the first supporting member ranges from about 300 nm to about 30,000 nm, a length of the second supporting member ranges from about 300 nm to about 30,000 nm, and a length of the third supporting member ranges from about 300 nm to about 30,000 nm.

18. The structure of claim 12, wherein each of the first supporting member, the second supporting member and the third supporting member comprise an insulation material.

19. The structure of claim 12, wherein a ratio of the gap width to the second width ranges from about 5 to about 30.

20. The structure of claim 15, wherein the trench has a trench width, and a ratio of the trench width to the second width ranges from about 2 to about 3.

* * * * *